United States Patent [19]

Tamura et al.

[11] Patent Number: 5,433,000
[45] Date of Patent: Jul. 18, 1995

[54] MANUFACTURING METHOD FOR A MULTILAYER WIRING BOARD

[75] Inventors: Toshio Tamura; Nobuyuki Yasuda, both of Kanagawa, Japan

[73] Assignee: Sony Corporation, Tokyo, Japan

[21] Appl. No.: 210,470

[22] Filed: Mar. 21, 1994

Related U.S. Application Data

[62] Division of Ser. No. 768,021, Sep. 30, 1991, abandoned.

[51] Int. Cl.⁶ .............................................. H01K 3/10
[52] U.S. Cl. ........................................ 29/852; 29/830; 174/261
[58] Field of Search ........................ 29/830, 852, 829; 156/901; 174/261

[56] References Cited

U.S. PATENT DOCUMENTS 3,436,819  4/1969  Lunine .
4,729,061  3/1988  Brown .
5,191,174  3/1993  Chang et al. .

FOREIGN PATENT DOCUMENTS 2548258  5/1977  Germany .
3639402  5/1988  Germany .............................. 29/829

*Primary Examiner*—Carl J. Arbes
*Attorney, Agent, or Firm*—Hill, Steadman & Simpson

[57] ABSTRACT

A multilayer wiring board is constructed of insulating substrates and circuit patterns formed thereon. A manufacturing method produces the multilayer wiring board by forming a mask on one surface of the multilayer substrate. The mask has apertures registered with blind holes and/or a through hole wherein the apertures have different diameters depending on the depths of the blind holes and/or the through hole such that the larger the depth, the larger the diameter. Etching is performed on the multilayer substrate corresponding to the smallest aperture using an abrasive powder having a particle size smaller than the diameter of the smallest aperture. Portions of the multilayer substrate are gradually etched corresponding to the other apertures using abrasive powders having particle sizes smaller than the diameters of the other apertures wherein the blind holes having the desired depths and/or the through hole are formed in the multilayer substrate. Accordingly, the blind holes having different depths and/or the through hole can be formed by using the single mask. Further, the required depths of the blind holes and/or the through hole can be obtained without unduly etching the bottom of the blind holes. A reliable electrical connection can be obtained between the circuit patterns in the different layers through the conductive films formed on the inner wall surfaces of the blind holes and/or the through hole.

4 Claims, 6 Drawing Sheets

MANUFACTURING METHOD FOR A MULTILAYER WIRING BOARD

This is a division, of application Ser. No. 07/768,021, filed Sep. 30, 1991 now abandoned.

BACKGROUND OF THE INVENTION

1. Field of the Invention

The present invention relates to a multilayer wiring board and a manufacturing method therefor. More particularly, the present invention relates to a multilayer wiring board comprising a plurality of insulating substrates laminated together to form a multilayer substrate; a plurality of circuit patterns formed on both surfaces or one surface of each of the insulating substrates, the multilayer substrate being formed with a plurality of blind holes having different depths and/or a through hole extending selectively through the circuit patterns and the insulating substrates; and a conductive film formed on an inner circumferential surface and a bottom surface of each of the blind holes and/or an inner circumferential surface of the through hole, for electrically connecting the circuit pattern perforated to the circuit pattern exposed to the bottom surface of each of the blind holes and/or electrically connecting the circuit patterns perforated to each other. The present invention also relates to a manufacturing method of such a multilayer wiring board.

2. Description of Related Art

In recent years, electronic equipments tend to be compact and multifunctional, and in association therewith, a high-density construction of wiring boards to be used in the electronic equipments has been progressed. The high-density construction has been realized by a so-called multilayer wiring board such that a plurality of circuit patterns are formed not only on both surfaces of a multilayer substrate constructed of a plurality of insulating substrates but also on each insulating substrate forming an inner layer, and the circuit patterns in different layers of the multilayer substrate are electrically connected with each other.

The electrical connection between the circuit patterns in different two layers is realized by forming a through hole extending through the two circuit patterns and the insulating substrate interposed therebetween or forming a blind hole extending through one of the two circuit patterns and the insulating substrate and having a bottom exposed to the other circuit pattern, and by forming a conductive film on an inner circumferential surface of the through hole or on both an inner circumferential surface and the bottom of the blind hole. It is appreciated that the smaller the diameter of the through hole or the blind hole, the higher the wiring density of the wiring board. However, it is technically difficult to reduce the diameter of the through hole or the blind hole. Practically, it is impossible to form the blind hole having a diameter of 0.3 mm or less by drilling.

Another method of forming such a hole by blasting an abrasive powder against the multilayer substrate is described in Japanese Patent Application No. 2-135665 filed by the present applicant.

FIGS. 4 and 5A to 5F show a multilayer wiring board and a manufacturing method therefor as described in this reference.

Figure 4:
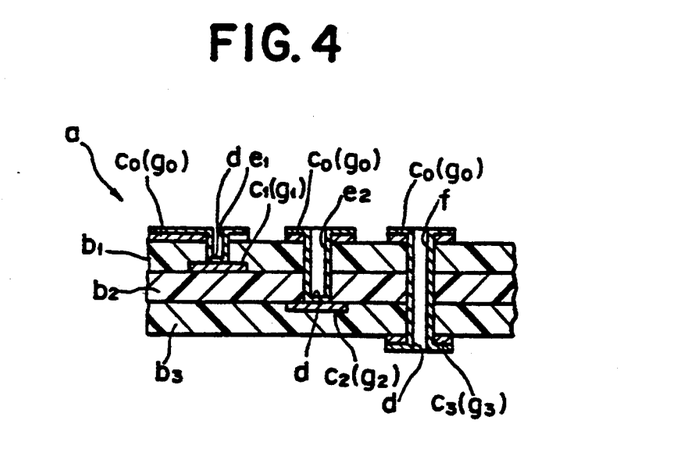
FIG. 4 is an enlarged sectional view of the multilayer wiring board in the prior art.

Referring to FIG. 4, reference character a generally denotes a multilayer wiring board; $b_1$, $b_2$ and $b_3$ denote insulating substrates; $c_0$, $c_1$, $c_2$ and $c_3$ denote circuit patterns respectively formed from copper foils $g_0$, $g_1$, $g_2$ and $g_3$ on the insulating substrates $b_1$, $b_2$ and $b_3$.

Reference characters d denote conductive films formed to provide electrical connection among the circuit patterns $c_0$ to $c_3$ through the different layers. A blind hole $e_1$ is formed through the circuit pattern $c_0$ and the insulating substrate $b_1$. Another blind hole $e_2$ is formed through the circuit pattern $c_0$ and the insulating substrates $b_1$ and $b_2$. A through hole f is formed through the circuit patterns $c_0$, the insulating substrates $b_1$, $b_2$ and $b_3$, and the circuit pattern $c_3$. The conductive films d are formed on the inner circumferential surfaces of the blind holes $e_1$ and $e_2$ and the through hole f and on the connecting portions of the circuit patterns $c_0$ to $c_3$.

The multilayer wiring board a having such a construction is manufactured in the following manner.

Figure 5A:
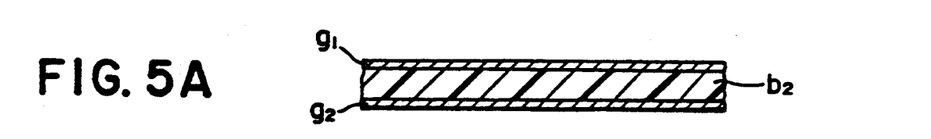
FIGS. 5A to 5F are enlarged sectional views illustrating the conventional manufacturing method for the multilayer wiring board shown in FIG. 4.
Figure 5B:
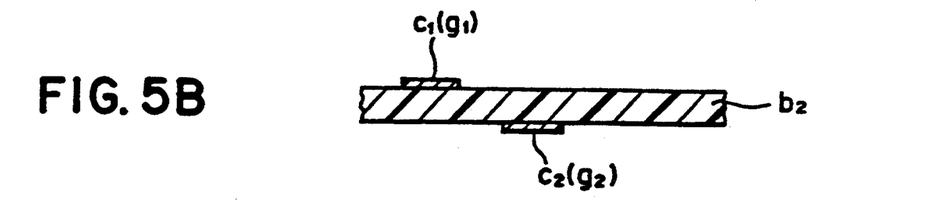

First, the insulating substrate $b_2$ having both surfaces on which the copper foils $g_1$ and $g_2$ are laminated is prepared (see FIG. 5A), and the copper foils $g_1$ and $g_2$ are partially removed by photoetching to form the predetermined circuit patterns $c_1$ and $c_2$ (see FIG. 5B). Then, the other insulating substrates $b_1$ and $b_3$ are laminated on both surfaces of the insulating substrate $b_2$ so as to fully cover the circuit patterns $c_1$ and $c_2$, and then the copper foils $g_0$ and $g_3$ are laminated on both surfaces of such a laminated body constructed of the insulating substrates $b_1$, $b_2$ and $b_3$, thus forming a multilayer substrate h (see FIG. 5C).

Figure 5C:
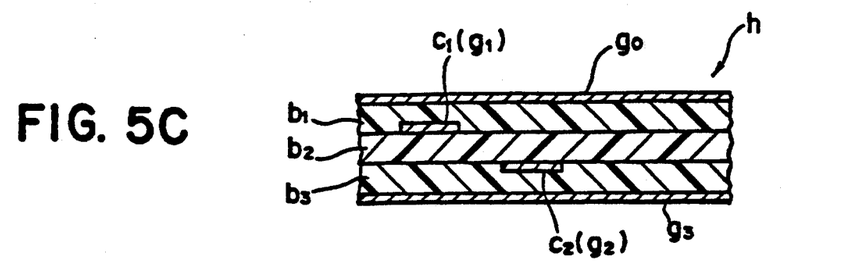

Next, the blind holes $e_1$ and $e_2$ and the through hole f are formed at predetermined positions of the multilayer substrate h in accordance with the following steps.

The blind holes $e_1$ and $e_2$ are different in depth from each other. The blind hole $e_1$ extends through the copper foil $g_0$ (to be formed into the circuit pattern $c_0$) formed on the upper surface of the multilayer substrate h and further extends through the insulating substrate $b_1$ of the first layer in such a manner that the circuit pattern $c_1$ (formed from the copper foil $g_1$) formed on the upper surface of the insulating substrate $b_2$ is exposed to the bottom of the blind hole $e_1$. The blind hole $e_2$ is deeper than the blind hole $e_1$, and extends through the copper foil $g_0$, the insulating substrate $b_1$ of the first layer, and the insulating substrate 2 of the second layer in such a manner that the circuit pattern $c_2$ (formed from the copper foil $g_2$) formed on the lower surface of the insulating substrate $b_2$ is exposed to the bottom of the blind hole $e_2$.

The blind holes $e_1$ and $e_2$ and the through hole f are formed at predetermined positions of the multilayer substrate h in accordance with the following steps.

Figure 5D:
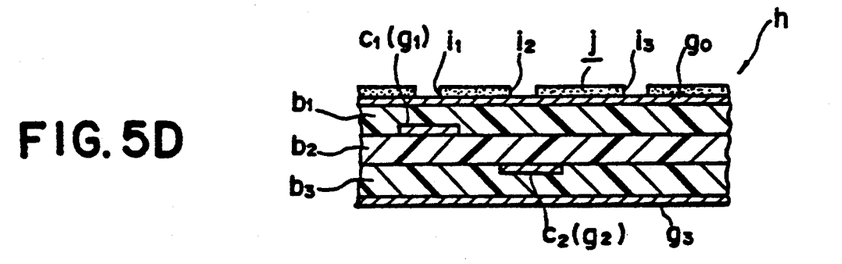

First, a mask j having small apertures $i_1$, $i_2$ and $i_3$ of a predetermined size identical in diameter are formed on one surface of the multilayer substrate h on the side where the blind holes $e_1$ and $e_2$ are to be formed (see FIG. 5D). The apertures $i_1$, $i_2$ and $i_3$ of the mask j are registered with the forming positions of the blind holes $e_1$ and $e_2$ and the through hole f, respectively. Then, an abrasive powder (not shown) is blasted against the upper surface of the multilayer substrate h on which the mask j has been formed, so as to etch the portions of the multilayer substrate h corresponding to the apertures $i_1$, $i_2$ and $i_3$.

The mask j to be employed herein is formed of such a material as not to be etched by the blasting of the abrasive powder. For example, a photosensitive urethane rubber is preferably used.

The mask j is formed by first applying a photosensitive material on the entire surface of the multilayer substrate h on the side where the blind holes $e_1$ and $e_2$ are to be formed later, then irradiating ultraviolet rays through a photomask to the coating of the photosensitive material, and then selectively removing the portions of the coating to be formed into the apertures $i_1$, $i_2$ and $i_3$.

Figure 5E:
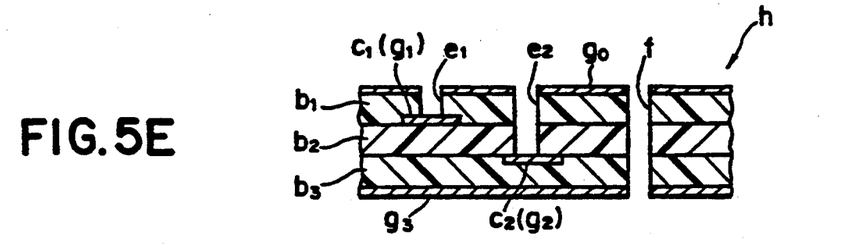

When the abrasive powder is blasted against the upper surface of the multilayer substrate h on which the mask j has been formed, the copper/oil $g_0$ exposed to the first aperture $i_1$ of the mask j and the insulating substrate $b_1$ disposed under the copper foil $g_0$ are etched by the abrasive powder to form the blind hole $e_1$; the copper foil $g_0$ exposed to the second aperture $i_2$ of the mask j, the insulating substrate $b_1$ disposed under the copper foil $g_0$, and the insulating substrate $b_2$ disposed under the insulating substrate $b_1$ are etched by the abrasive powder to form the blind hole $e_2$; and the copper foil $g_0$ exposed to the third aperture $i_3$ of the mask j, the insulating substrates $b_1$, $b_2$ and $b_3$, and the copper foil $g_3$ disposed under the insulating substrate $b_3$ are etched by the abrasive powder to form the through hole f (see FIG. 5E).

Figure 5F:
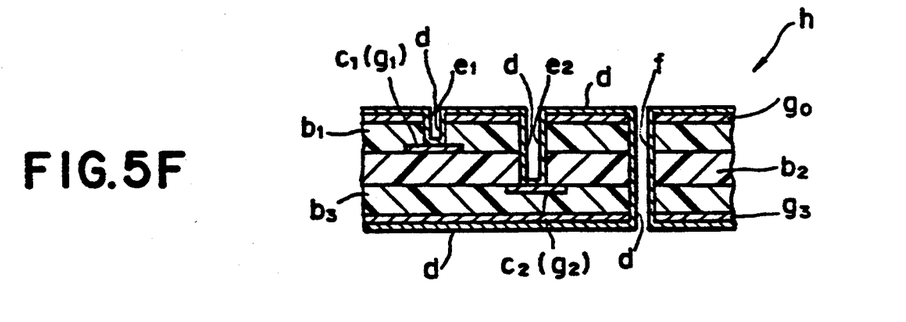

Thereafter, copper plating is carried out on both surfaces of the multilayer substrate h, the inner circumferential surfaces and the bottom surfaces of the blind holes $e_1$ and $e_2$, and the inner circumferential surface of the through hole f, thereby forming the conductive film d for effecting electrical connection among the copper foils $g_0$ and $g_3$ and the circuit patterns $c_1$ and $c_2$ (see FIG. 5F).

Finally, the copper foils $g_0$ and $g_3$ formed on the upper and lower surfaces of the multilayer substrate h are partially removed together with the conductive film d by photoetching to thereby form the circuit patterns $c_0$ and $c_3$. Thus, the multilayer wiring board a shown in FIG. 4 is completed.

However, the multilayer wiring board and the manufacturing method therefor in the prior art as mentioned above have the following defects.

First, in the plating step wherein a plating liquid is admitted into the blind holes $e_1$ and $e_2$ and the through hole f, the plating liquid is hard to penetrate into the deep blind hole $e_2$. Accordingly, a plating layer is not entirely formed on the inner circumferential surface and the bottom surface of the blind hole $e_2$. As a result, the electrical connection between the circuit patterns $c_0$ and $c_2$ cannot be secured.

Secondly, in the blasting step wherein the abrasive powder is blasted against the upper surface of the multilayer substrate h to form the blind holes $e_1$ and $e_2$ and the through hole f, since the blind holes $e_1$ and $e_2$ and the through hole f have different depths, it is necessary to spot-blast the abrasive powder so as to individually form the blind holes $e_1$ and $e_2$ and the through hole f, or repeat the formation of the mask j and the blasting of the abrasive powder every time each of the holes is formed. As a result, much time for the blasting step is required.

In the case that the difference in depth between the blind holes $e_1$ and $e_2$ is small, it is considered that both the blind holes $e_1$ and $e_2$ may be simultaneously formed because an etching rate of the insulating substrate is different from that of the copper foil. For instance, by blasting the abrasive powder to simultaneously etch the portions of the multilayer substrate h corresponding to the apertures $i_1$ and $i_2$ of the mask j, the blind hole $e_1$ is first formed so that the circuit pattern $c_1$ interposed between the insulating substrate $b_1$ of the first layer and the insulating substrate $b_2$ of the second layer may be exposed to the bottom of the blind hole $e_1$, and then the blasting of the abrasive powder is continued to etch the insulating substrate $b_2$ of the second layer until the bottom of the blind hole $e_2$ reaches the circuit pattern $c_2$ interposed between the insulating substrate $b_2$ of the second layer and the insulating substrate $b_3$ of the third layer. At this time, the bottom of the blind hole $e_1$, that is, the circuit pattern $c_1$ is also etched by the abrasive powder. However, since the etching rate of the circuit pattern $c_1$ (the copper foil $g_1$) is low, the circuit pattern $c_1$ is not perforated but the upper surface thereof is slightly cut out. Finally, when the circuit pattern $c_2$ becomes exposed to the bottom of the blind hole $e_2$, the blasting of the abrasive powder is stopped. Thus, the blind holes $e_1$ and $e_2$ having different depths can be formed in the multilayer substrate h in such a manner that the circuit patterns $c_1$ and $c_2$ are exposed to the bottoms of the blind holes $e_1$ and $e_2$, respectively.

However, in the above case where the blind holes $e_1$ and $e_2$ having different depths are simultaneously formed, there is a possibility that the circuit pattern $c_1$ exposed to the bottom of the blind hole $e_1$ having a small depth is unduly etched or perforated under certain circumstances to cause a problem that the electrical connection by the conductive film to be formed later cannot be secured.

SUMMARY OF THE INVENTION

It is accordingly an object of the present invention to provide a novel multilayer wiring board which can secure electrical connection between circuit patterns formed in different layers by designing the diameters of the blind holes having different depths and/or the through hole.

It is another object of the present invention to provide a novel manufacturing method which can manufacture the multilayer wiring board of the present invention securely and quickly.

The multilayer wiring board of the present invention comprises a plurality of insulating substrates laminated together to form a multilayer substrate; a plurality of circuit patterns formed on both surfaces or one surface of each of the insulating substrates, the multilayer substrate being formed with a plurality of blind holes having different depths and/or a through hole extending selectively through the circuit patterns and the insulating substrates; and a conductive film formed on an inner circumferential surface and a bottom surface of each of the blind holes and/or an inner circumferential surface of the through hole, for electrically connecting the circuit pattern perforated to the circuit pattern exposed the bottom surface of each of the blind holes and/or electrically connecting the circuit patterns perforated to each other; wherein the blind holes and/or the through hole have different diameters depending on the depths of the blind holes and/or the through hole in such a manner that the larger the depth, the larger the diameter.

According to the multilayer wiring board of the present invention, a substance for forming the conductive film on the inner wall surfaces of the blind holes and/or the through hole, e.g., a plating liquid can securely penetrate into the blind holes and/or the through hole even when the depths of any of the blind holes and/or the through hole are large. Accordingly, the electrical connection between the circuit patterns in the different layers farther isolated from each other can be secured.

The manufacturing method for the multilayer wiring board in a first aspect of the present invention is a manufacturing method for a multilayer wiring board comprising a plurality of insulating substrates laminated together to form a multilayer substrate; a plurality of circuit patterns formed on both surfaces or one surface of each of the insulating substrates, the multilayer substrate being formed with a plurality of blind holes having different depths and/or a through hole extending selectively through the circuit patterns and the insulating substrates; and a conductive film formed on an inner circumferential surface and a bottom surface of each of the blind holes and/or an inner circumferential surface of the through hole, for electrically connecting the circuit pattern perforated to the circuit pattern exposed to the bottom surface of each of the blind holes and/or electrically connecting the circuit patterns perforated to each other; the manufacturing method comprising the steps of forming a mask on one surface of the multilayer substrate, the mask having a plurality of apertures registered with the blind holes and/or the through hole to be formed later, the apertures having different diameters depending on the depths of the blind holes and/or the through hole in such a manner that the larger the depth, the larger the diameter; blasting an abrasive powder having a particle size smaller than the diameter of a smallest one of the apertures of the mask against the one surface of the multilayer substrate on which the mask is formed, so as to form a shallowest one of the blind holes at a position corresponding to the smallest aperture and simultaneously form unfinished holes having the same depth as that of the shallowest blind hole at positions corresponding to the other apertures; blasting an abrasive powder having a particle size larger than the diameter of the smallest aperture but smaller than the diameter of a second smallest one of the apertures against the one surface of the multilayer substrate on which the mask is formed, so as to form a second shallowest one of the blind holes at the position corresponding to the second smallest aperture; and finally blasting an abrasive powder having a particle size larger than the diameter of a second largest one of the apertures but smaller than the diameter of a largest one of the apertures against the one surface of the multilayer substrate on which the mask is formed, so as to form a deepest one of the blind holes or the through hole at the position corresponding to the largest aperture; whereby the blind holes and/or the through hole are stepwise formed in the multilayer substrate at the positions corresponding to the apertures of the mask in the increasing order of the diameters of the apertures.

Moreover, the manufacturing method for the multilayer wiring board in a second aspect of the present invention is a manufacturing method for a multilayer wiring board comprising a plurality of insulating substrates laminated together to form a multilayer substrate; a plurality of circuit patterns formed on both surfaces or one surface of each of the insulating substrates, the multilayer substrate being formed with a plurality of blind holes having different depths and/or a through hole extending selectively through the circuit patterns and the insulating substrates; and a conductive film formed on an inner circumferential surface and a bottom surface of each of the blind holes and/or an inner circumferential surface of the through hole, for electrically connecting the circuit pattern perforated to the circuit pattern exposed to the bottom surface of each of the blind holes and/or electrically connecting the circuit patterns perforated to each other; the manufacturing method comprising the steps of forming a mask on one surface of the multilayer substrate, the mask having a plurality of apertures registered with the blind holes and/or the through hole to be formed later, the apertures having different diameters depending on the depths of the blind holes and/or the through hole in such a manner that the larger the depth, the larger the diameter; blasting an abrasive powder having a particle size smaller than the diameter of a largest one of the apertures of the mask but larger than the diameter of a second largest one of the apertures against the one surface of the multilayer substrate on which the mask is formed, so as to form an unfinished hole having a depth smaller than a desired depth at the position corresponding to the largest aperture; blasting an abrasive powder having a particle size smaller than the diameter of the second largest aperture but larger than the diameter of a third largest one of the apertures against the one surface of the multilayer substrate on which the mask is formed, so as to form an unfinished hole having a depth smaller than a desired depth at the position corresponding to the second largest aperture and simultaneously etch a bottom surface of the unfinished hole formed at the position corresponding to the largest aperture; finally blasting an abrasive powder having a particle size smaller than the diameter of a smallest one of the apertures against the one surface of the multilayer substrate on which the mask is formed, so as to form a shallowest one of the blind holes at the position corresponding to the smallest aperture; whereby the blind holes and/or the through hole are gradually formed in the multilayer substrate at the positions corresponding to the apertures of the mask in the decreasing order of the diameters of the apertures in such a manner that at the same time when the shallowest blind hole is completed, the other blind holes and/or the through hole are completed.

According to the first and second aspects of the manufacturing method of the present invention, the blind holes having different depths and/or the through hole can be formed by using the single mask. Further, the respective required depths of the blind holes and/or the through hole can be obtained without unduly etching the bottom of the blind hole having a small depth, and reliable electrical connection can therefore be obtained between the circuit patterns in the different layers through the conductive films formed on the inner wall surfaces of the blind holes and/or the through hole.

Other objects and features of the invention will be more fully understood from the following detailed description and appended claims when taken with the accompanying drawings.

DETAILED DESCRIPTION OF THE PREFERRED EMBODIMENTS

There will now be described in detail some preferred embodiments of the multilayer wiring board and the manufacturing method therefor according to the present invention.

(First Preferred Embodiment)

Figure 1:
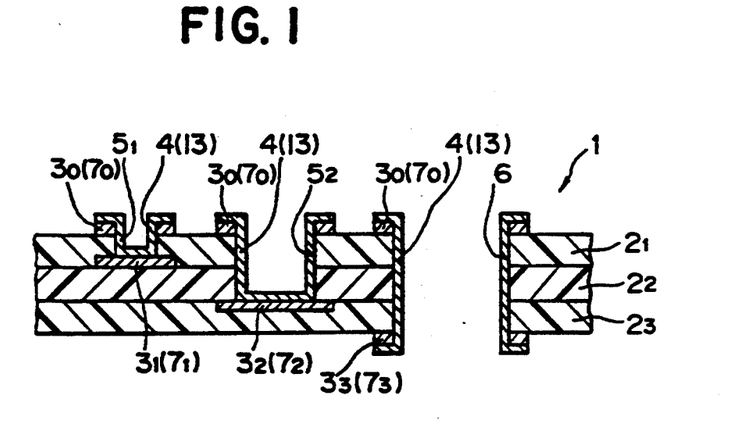
FIG. 1 is an enlarged sectional view of an essential part of the multilayer wiring board according to a first preferred embodiment of the present invention.

FIG. 1 shows a multilayer wiring board manufactured by the manufacturing method according to the present invention.

In FIG. 1, reference numeral 1 generally designates a multilayer wiring board; $2_1$, $2_2$, and $2_3$ designate insulating substrates; and $3_0$, $3_1$, $3_2$ and $3_3$ designate circuit patterns formed from copper foils $7_0$, $7_1$, $7_2$ and $7_3$ on the insulating substrates $2_1$, $2_2$ and $2_3$.

Reference numerals 4 designate conductive films formed to provide electrical connection among the circuit patterns $3_0$, $3_1$, $3_2$ and $3_3$ through the different layers. A blind hole $5_1$ is formed through the circuit pattern $3_0$ and the insulating substrate $2_1$. Another blind hole $5_2$ is formed through the circuit pattern $3_0$ and the insulating substrates $2_1$ and $2_2$. A through hole 6 is formed through %he circuit pattern $3_0$, the insulating substrates $2_1$, $2_2$ and $2_3$ and the circuit pattern $3_3$. The conductive films 4 are formed on the inner circumferential surfaces of the blind holes $5_1$ and $5_2$ and the through hole 6 and on the connecting portions of the circuit patterns $3_0$, $3_1$, $3_2$ and $3_3$.

The blind hole $5_2$ having a large depth is larger in diameter than the blind hole $5_1$ having a small depth. The through hole 6 is larger in diameter than the blind hole $5_2$.

The multilayer wiring board 1 having such a construction is manufactured in the following manner.

Figure 2A:
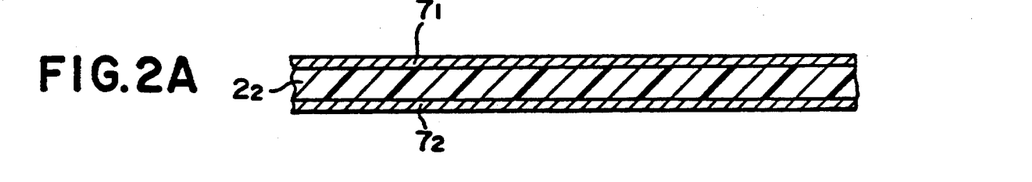
FIGS. 2A to 2H are enlarged sectional views illustrating the steps of the manufacturing method for the multilayer wiring board according to the first preferred embodiment.
Figure 2B:
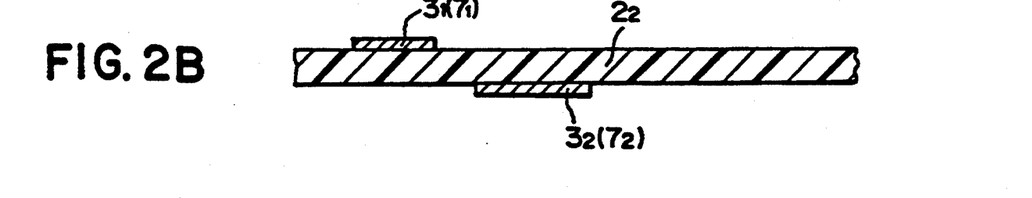

First, the insulating substrate $2_2$ having both surfaces on which the copper foils $7_1$ and $7_2$ are laminated is prepared (see FIG. 2A), and the copper foils $7_1$ and $7_2$ are partially removed by photoetching to form the predetermined circuit patterns $3_1$ and $3_2$ (see FIG. 2B). Then, the other insulating substrates $2_1$ and $2_3$ are laminated on both surfaces of the insulating substrate $2_2$ so as to fully cover the circuit patterns 3and $3_2$, and then the copper foils $7_0$ and $7_3$ are laminated on both surfaces of such a laminated body constructed of the insulating substrates $2_1$, $2_2$ and $2_3$, thus forming a multilayer substrate 8 (see FIG. 2C).

Figure 2C:
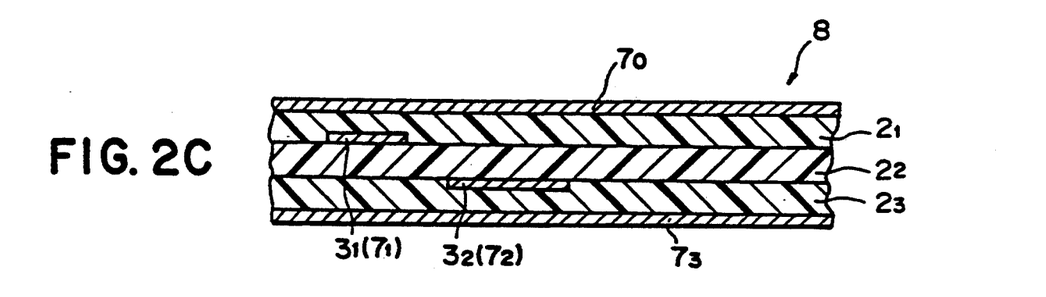

Next, the blind holes $5_1$ and $5_2$ and the through hole 6 are formed at predetermined positions of the multilayer substrate 8 in accordance with the following steps.

Figure 2D:
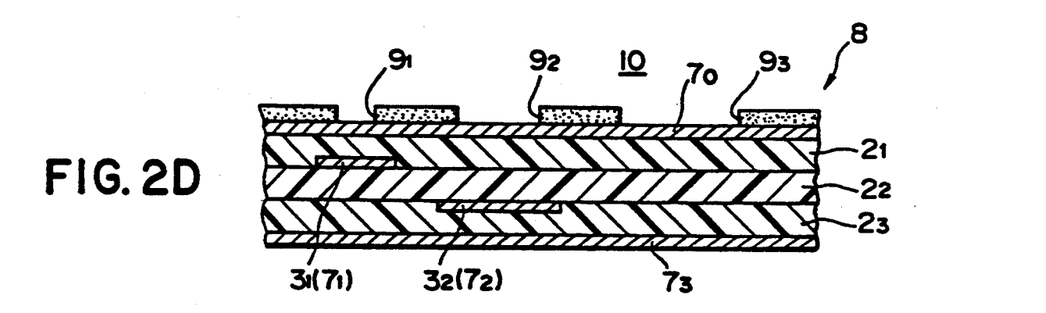

First, a mask 10 having small apertures $9_1$, $9_2$ and $9_3$ of predetermined sizes different in diameter are formed on one surface of the multilayer substrate 8 on the side where the blind holes $5_1$ and $5_2$ are to be formed later (see FIG. 2D). The apertures $9_1$, $9_2$ and $9_3$ of the mask 10 are registered with the forming positions of the blind holes $5_1$ and $5_2$ and the through hole 6, respectively. The first aperture $9_1$ corresponding to the blind hole $5_1$ having a small depth has the smallest diameter. The second aperture $9_2$ corresponding to the blind hole $5_2$ having a large depth is larger in diameter than the first aperture $9_1$. The third aperture $9_3$ corresponding to the through hole 6 is larger in diameter than the second aperture $9_2$. For instance, the diameter of the first aperture $9_1$ is set to 50 $\mu$m; the diameter of the second aperture $9_2$ is set to 100 $\mu$m; and the diameter of the third aperture is set to 150 $\mu$m.

The mask 10 is formed of a photosensitive urethane rubber, for example. The mask 10 is formed by first applying this photosensitive material on the entire surface of the multilayer substrate 8 on the side where the blind holes $5_1$ and $5_2$ are to be formed, then irradiating ultraviolet rays through a photomask to the coating of the photosensitive material, and then selectively removing the portions of the coating to be formed into the apertures $9_1$, $9_2$ and $9_3$. Thus, the mask 10 having the apertures $9_1$, $9_2$ and $9_3$ is formed on the multilayer substrate 8.

The mask 10 serves to prevent thai the other portion of the multilayer substrate 8 except the portions corresponding to the apertures $9_1$, $9_2$ and $9_3$ is etched off by blasting of abrasive powders $11_1$, $11_2$ and $11_3$ which will be hereinafter described. The material of the mask 10 is not limited to the photosensitive urethane rubber, but it necessarily has an elasticity for rebounding the abrasive powders $11_1$, $11_2$ and $11_3$ blasted. Further, the forming method for the mask 10 is not limited to photoetching. However, photoetching is preferable for the formation of the small apertures of 50 $\mu$m, 100 $\mu$m and 150 $\mu$m in diameter as in this preferred embodiment since the small apertures can be formed faster and at lower costs.

Figure 2E:
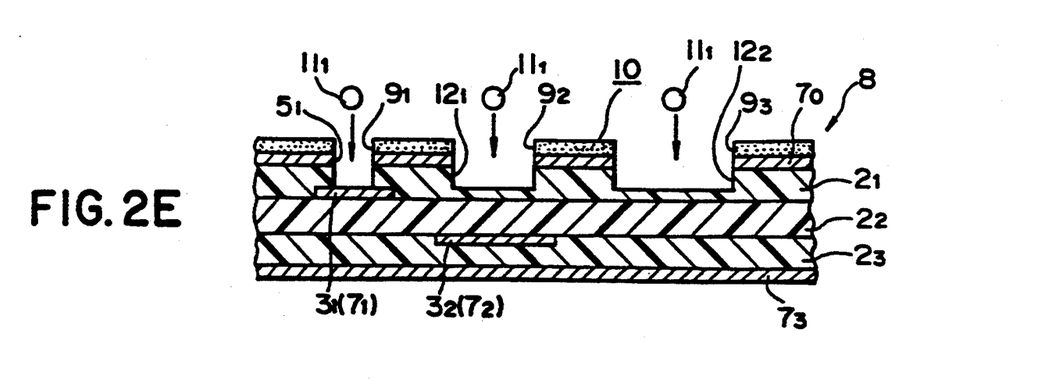

After thus forming the mask 10 on the multilayer substrate 8, the abrasive powder $11_1$ having a particle size (20–30 $\mu$m) smaller than the diameter (50 $\mu$m) of the first aperture $9_1$ is blasted against the upper surface of the multilayer substrate 8 on the side where the mask 10 has been formed, thereby forming the blind hole $5_1$ in such a manner that the circuit pattern $3_1$ interposed between the insulating substrate $2_1$ of the first layer and the insulating substrate $2_2$ of the second layer is exposed to the bottom of the blind hole $5_1$ (see FIG. 2E).

At this time, as the abrasive powder $11_1$ also passes through the second and third apertures $9_2$ and $9_3$, the portions of the multilayer substrate 8 corresponding to the second and third apertures $9_2$ and $9_3$, that is, the forming portions for the blind hole $5_2$ and the through hole 6 are also etched by the abrasive powder $11_1$ to respectively form unfinished holes $12_1$ and $12_2$ having the same depth as that of the blind hole $5_1$.

In the next step, the abrasive powder $11_2$ having a particle size (60–80 $\mu$m) larger than the diameter (50 $\mu$m) of the first aperture $9_1$ but smaller than the diameter (100 $\mu$m) of the second aperture $9_2$ is blasted to etch the bottoms of the unfinished holes $12_1$ and $12_2$. Thus, the bottom of the unfinished hole $12_1$ is etched by the abrasive powder $11_2$ to form the blind hole $5_2$ in such a manner that the circuit pattern $3_2$ interposed between the insulating substrate $2_2$ of the second layer and the insulating substrate $2_3$ of the third layer is exposed to the bottom of the blind hole $5_2$ (see FIG. 2F)

Figure 2F:
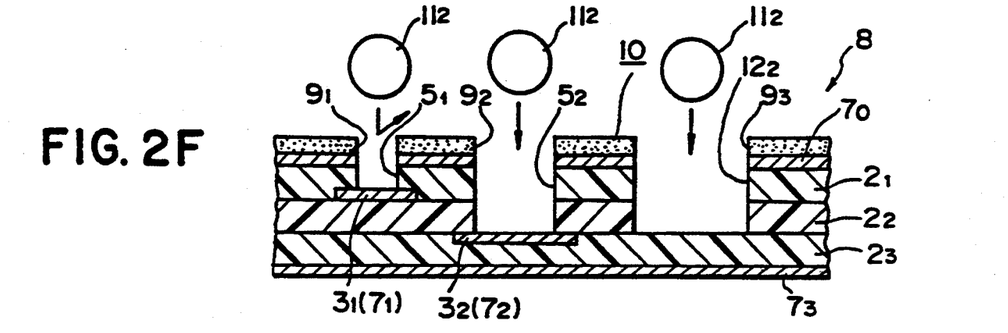

At this time, as the abrasive powder $11_2$ cannot pass through the first aperture $9_1$ corresponding to the blind hole $5_1$ which has already been formed, the bottom of the blind-hole $5_1$ is not etched by the abrasive powder $11_2$. On the other hand, the bottom of the unfinished hole $12_2$ corresponding to the third aperture $9_3$ is etched by the abrasive powder $11_2$ to form an unfinished hole $12_2'$ having the same depth as that of the blind hole $5_2$.

Figure 2G:
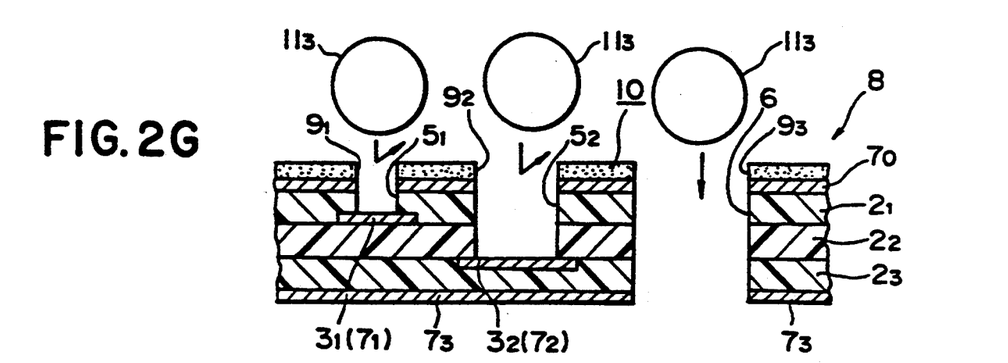

In the next step, the abrasive powder $11_3$ having a particle size (110–130$\mu$m) larger than the diameter (100$\mu$m) of the second aperture $9_2$ but smaller than the diameter (150$\mu$m) of the third aperture $9_3$ is blasted to etch the bottom of the unfinished hole $12_2'$, that is, to perforate the insulating substrate $2_3$ of the third layer and the copper foil $7_3$ formed just under the insulating substrate $2_3$, thereby forming the through hole 6 (see FIG. 2G).

At this time, as the abrasive powder $11_3$ cannot pass through the first and second apertures $9_1$ and $9_2$ respectively corresponding to the blind hole $5_1$ and $5_2$ which have already been formed, the bottoms of the blind holes $5_1$ and $5_2$ are not etched by the abrasive powder $11_3$. That is, the circuit patterns $3_1$ and $3_2$ respectively exposed to the bottoms of the blind holes $5_1$ and $5_2$ are not etched by the abrasive powder $11_3$.

Thus, the blind holes $5_1$ and $5_2$ and the through hole 6 different in diameter and depth can be formed by blasting the abrasive powders $11_1$, $11_2$ and $11_3$ different in particle size in this order.

Next, the multilayer substrate 8 shown in FIG. 2G is immersed into a copper plating liquid to carry out copper plating on the inner wall surfaces of the blind holes $5_1$ and $5_2$ and the through hole 6 as well as on both surfaces of the multilayer substrate 8. In general, a plating liquid is hard to penetrate into a deep blind hole. However, as the deep blind hole $5_2$ in this preferred embodiment has a relatively large diameter, the copper plating liquid can be sufficiently admitted into the blind hole $5_2$.

Figure 2H:
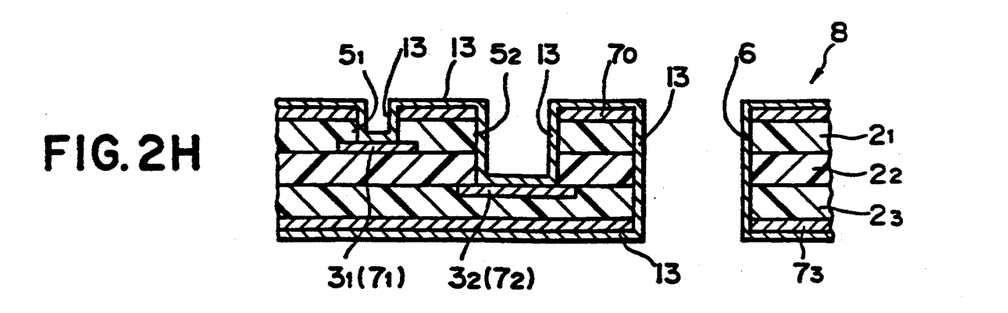

Thus, the multilayer substrate 8 immersed in the copper plating liquid is plated with copper to form a copper foil 13 on both surfaces of the multilayer substrate 8 and the inner wall surfaces of the blind holes $5_1$ and $5_2$ and the through hole 6 (see FIG. 2H). Accordingly, the copper foil $7_0$ formed on the upper surface of the multilayer substrate 8 is electrically connected to the circuit pattern $3_1$ exposed to the bottom the blind hole $5_1$ through the copper foil 13 as the conductive film 4 formed on the inner circumferential surface and the bottom of the blind hole $5_1$. Similarly, the copper foil $7_0$ formed on the upper surface of the multilayer substrate 8 is electrically connected to the circuit pattern $3_2$ exposed to the bottom of the blind hole $5_2$ through the copper foil 13 as the conductive film 4 formed on the inner circumferential surface and the bottom of the blind hole $5_2$. Further, the copper foil. $7_0$ formed on the upper surface of the multilayer substrate 8 is electrically connected to the copper foil $7_3$ formed on the lower surface of the multilayer substrate 8 through the copper foil 13 as the conductive film 4 formed on the inner circumferential surface of the through hole 6.

Finally, the copper foils $7_0$ and $7_3$ and the copper foils 13 formed on both surfaces of the multilayer substrate 8 shown in FIG. 2H are partially removed by photoetching to form the predetermined circuit patterns $3_0$ and $3_3$. Thus, as shown in FIG. 1, the multilayer wiring board 1 is obtained, in which the circuit pattern $3_0$ formed on the upper surface of the multilayer substrate 8 is electrically connected to the circuit pattern $3_1$ interposed between the insulating substrates $2_1$ and $2_2$ through the conductive film 4 formed on the inner circumferential surface and the bottom of the blind hole $5_1$; the circuit pattern $3_0$ formed on the upper surface of the multilayer substrate 8 is electrically connected to the circuit pattern $3_2$ interposed between the insulating substrates $2_2$ and $2_3$ through the conductive film 4 formed on the inner circumferential surface and the bottom of the blind hole $5_2$; and the circuit pattern $3_0$ formed on the upper surface of the multilayer substrate 8 is electrically connected to the circuit pattern $3_3$ formed on the lower surface of the multilayer substrate 8 through the conductive film 4 formed on the inner circumferential surface of the through hole 6. (Second Preferred Embodiment)

Figure 3A:
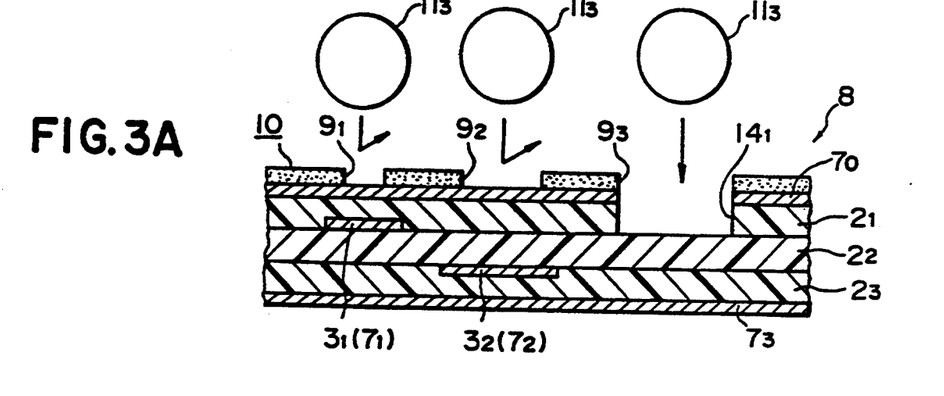
FIGS. 3A to 3C are enlarged sectional views illustrating the steps of the manufacturing method according to a second preferred embodiment of the present invention.
Figure 3B:
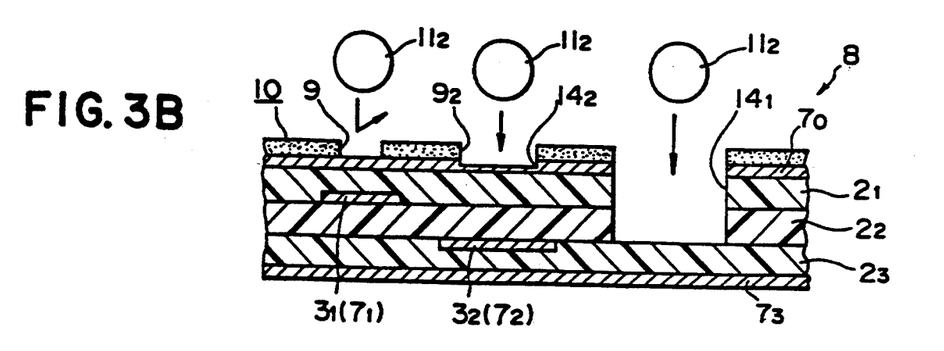
Figure 3C:
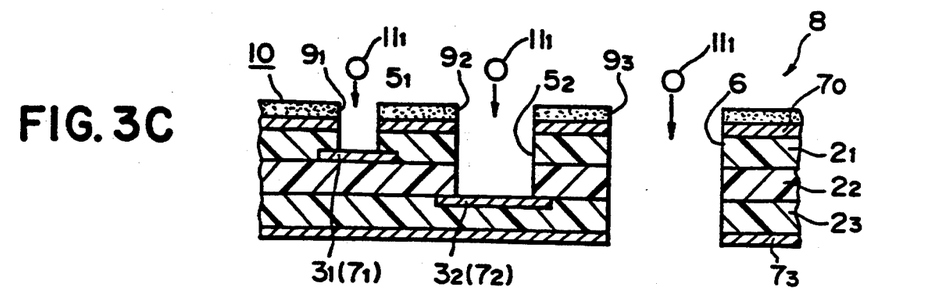

FIGS. 3A to 3C show a second preferred embodiment of the manufacturing method according to the present invention. While the second preferred embodiment is different in process from the first preferred embodiment, a multilayer wiring board to be manufactured by the second preferred embodiment is identical with that manufactured by the first preferred embodiment.

The difference between the first preferred embodiment and the second preferred embodiment is that the order of blasting of the abrasive powders $11_1$, $11_2$ and $11_3$ having different particle sizes in the second preferred embodiment is merely reverse to that in the first preferred embodiment. Accordingly, the following description of the second preferred embodiment will be directed primarily to this difference from the first preferred embodiment, and the same or like parts as those mentioned in the first preferred embodiment will be denoted by the same reference numerals with the detailed description thereof omitted herein.

In the same manner as in the first preferred embodiment, the mask 10 is formed on the upper surface of the multilayer substrate 8. The mask 10 is formed with the small apertures $9_1$, $9_2$ and $9_3$ having different diameters at the predetermined positions where the blind holes $5_1$ and $5_2$ and the through hole 6 are to be formed, respectively.

For instance, the diameter of the first aperture $9_1$ is set to 50$\mu$m; the diameter of the second aperture $9_2$ is set to 100$\mu$m; and the diameter of the third aperture $9_3$ is set to 150$\mu$m.

First, the abrasive powder $11_3$ having a particle size (110–130$\mu$m) larger than the diameter (100$\mu$m) of the second aperture $9_2$ but smaller than the diameter (150$\mu$m) of the third aperture $9_3$ is blasted against the upper surface of the multilayer substrate 8 on which the mask 10 has been formed, for a predetermined period of time, thereby forming an unfinished hole $14_1$ having a suitable depth in the multilayer substrate 8 at the position corresponding to the third aperture $9_3$ (see FIG. 3A).

At this time, as the abrasive powder $11_3$ cannot pass through the first and second apertures $9_1$ and $9_2$, the portions of the multilayer substrate 8 corresponding to the first and second apertures $9_1$ and $9_2$ are not etched by the abrasive powder $11_3$.

The depth of the unfinished hole $14_1$ is decided according to required etching periods of time for the blind holes $5_1$ and $5_2$ and the through hole 6.

For instance, it is assumed that the thickness of each the copper foils $7_0$ to $7_3$ is 20$\mu$m; the thickness of each of the insulating substrates $2_1$ to $2_3$ is 60$\mu$m; the etching rate of each of the copper foils $7_0$ to $7_3$ is 5$\mu$m/min; and the etching rate of each of the insulating substrates $2_1$ to $2_3$ is 30$\mu$m/min. In this case, the required etching time t1 of the blind hole $5_1$ becomes 6 minutes because the copper foil $7_0$ formed on the upper surface of the multilayer substrate 8 and the insulating substrate $2_1$ of the first layer are to be etched; the required etching time t2 of the blind hole $5_2$ becomes 8 minutes because the copper foil $7_0$ formed on the upper surface of the multilayer substrate 8, the insulating substrate $2_1$ of the first layer, and the insulating substrate $2_2$ of the second layer are to be etched; and the required etching time t3 of the through hole 6 becomes 14 minutes because the copper foils $7_0$ and $7_3$ formed on the upper and lower surfaces of the multilayer substrate 8 and all the insulating substrates $2_1$, $2_2$ and $2_3$ of the first, second and third layers are to be etched.

Accordingly, a required blasting time of the abrasive powder $11_3$ for forming the unfinished hole $14_1$ is decided as t3 −t2=6 minutes. In other words, the depth of the unfinished blind hole $14_1$ becomes equal to the sum of the thickness of the copper foil $7_0$ formed on the upper surface of the multilayer substrate 8 and the thickness of the insulating substrate $2_1$ of the first layer.

In the next step, the abrasive powder $11_2$ having a particle size (60–80μm) larger than the diameter (50μm) of the first aperture $9_1$ but smaller than the diameter (100μm) of the second aperture $9_2$ is blasted against the upper surface of the multilayer substrate 8 for a predetermined period of time (t2−t1=2 minutes) to thereby form an unfinished hole $14_2$ in the multilayer substrate 8 at the position corresponding to the second aperture $9_2$. The depth of the unfinished hole $14_2$ becomes half the thickness of the copper foil $7_0$ formed on the upper surface of the multilayer substrate 8 (see FIG. 3B).

At this time, as the abrasive powder $11_2$ cannot pass through the first aperture $9_1$, the portion of the multilayer substrate 8 corresponding to the first aperture $9_1$ is not etched. On the other hand, as the abrasive powder $11_2$ can pass through the third aperture $9_3$, the bottom of the unfinished hole $14_1$ which has already been formed is etched by the abrasive powder $11_2$ to thereby form an unfinished hole $14_1'$ having a depth corresponding to an etching time of t3−t1=8 minutes. In other words, the depth of the unfinished hole $14_1'$ becomes equal to the sum of the thickness of the copper foil $7_0$ formed on the upper surface of the multilayer substrate 8, the thickness of the insulating substrate $2_1$ of the first layer, and the thickness of the insulating substrate $2_2$ of the second layer.

In the next step, the abrasive powder $11_1$ having a particle size (10–30μm) smaller than the diameter (50μm) of the first aperture $9_1$ is blasted against the upper surface of the multilayer substrate 8 for a predetermined period of time (t1=6 minutes) to thereby etch the portion of the multilayer substrate 8 corresponding to the first aperture $9_1$ by substantially the same depth as the sum of the thickness of the copper foil $7_0$ formed on the upper surface of the multilayer substrate 8 and the thickness of the insulating substrate $2_1$ of the first layer, thus forming the blind hole $5_1$, the bottom of which is exposed to the circuit pattern $3_1$ interposed between the insulating substrate $2_1$ of the first layer and the insulating substrate $2_2$ of the second layer (see FIG. 3C).

At this time, as the abrasive powder $11_1$ can pass through the second and third apertures $9_2$ and $9_3$, the bottoms of the unfinished holes $14_2$ and $14_1'$ which have already been formed at the positions corresponding to the second and third apertures $9_2$ and $9_3$ are etched. Accordingly, the blind hole $5_2$ having a depth corresponding to the etching time t2 is formed at the position corresponding to the second aperture $9_2$, so that the bottom of the blind hole $5_2$ is exposed to the circuit pattern $3_2$ interposed between the insulating substrate $2_2$ of the second layer and the insulating substrate $2_3$ of the third layer. Further, the through hole 6 having a depth corresponding to the etching time t3 is formed at the position corresponding to the third aperture $9_3$, so that the through hole 6 extends across the multilayer substrate 8.

In this manner, by suitably controlling the respective blasting periods of time of the abrasive powders $11_3$, $11_2$ and $11_1$ having different particle sizes, the blind holes $5_1$ and $5_2$ and the through hole 6 having different depths and diameters can be formed in the multilayer substrate 8.

Thereafter, in the same manner as in the first preferred embodiment, copper plating is carried out on both surfaces of the multilayer substrate 8 having the blind holes $5_1$ and $5_2$ and the through hole 6 and on the inner wall surfaces of the blind holes $5_1$ and $5_2$ and the through hole 6. Then, etching is carried out on both surfaces of the multilayer substrate 8 to thereby form the desired circuit patterns $3_0$ and $3_3$. As a result, the multilayer wiring board 1 identical with that shown in FIG. 1 is obtained.

It will be appreciated that each etching rate of the copper foil and the insulating substrate depends on the size of the abrasive powder, the blasting speed of the abrasive powder, and so on. While a difference in etching rate depending on the size of the abrasive powder has not been considered in the above preferred embodiments, it should be noted that strictly to say, the larger the size of the abrasive powder or the higher the blasting speed of the abrasive powder, the higher the etching rate.

Further, although there has been illustrated in the above preferred embodiments that the two kinds of blind holes having different depths and the through hole are formed in the multilayer substrate, three or more kinds of blind holes having different depths and/or through holes may be formed in a multilayer substrate having four or more layers according to the present invention.

In addition, it is to be noted that the specific values of size, time, etc. mentioned in the above preferred embodiments are merely illustrative and that they are not to be construed as limiting the scope of the present invention.

What is claimed is:

1. A manufacturing method for a multilayer wiring board comprising a plurality of insulating substrates laminated together to form a multilayer substrate; a plurality of circuit patterns formed on both surfaces or one surface of each of said insulating substrates, said multilayer substrate being formed with a plurality of blind holes having different depths and/or a through hole extending selectively through said circuit patterns and said insulating substrates; and a conductive film formed on an inner circumferential surface and a bottom surface of each of said blind holes and/or an inner circumferential surface of said through hole, for electrically connecting said circuit pattern perforated to said circuit pattern exposed to the bottom surface of each of said blind holes and/or electrically connecting said circuit patterns perforated to each other;

said manufacturing method comprising the steps of:

forming a mask on one surface of said multilayer substrate, said mask having a plurality of apertures registered with said blind holes and/or said through hole to be formed later, said apertures having different diameters depending on the depths of said blind holes and/or said through hole in such a manner that the larger the depth, the larger the diameter;

blasting an abrasive powder having a particle size smaller than the diameter of a smallest one of said apertures of said mask against said one surface of said multilayer substrate on which said mask is formed, so as to form a shallowest one of said blind holes at a position corresponding to said smallest aperture and simultaneously form unfinished holes having the same depth as that of said shallowest blind hole at positions corresponding to the other apertures;

blasting an abrasive powder having a particle size larger than the diameter of said smallest aperture but smaller than the diameter of a second smallest one of said apertures against said one surface of said multilayer substrate on which said mask is formed, so as to form a second shallowest one of said blind holes at the position corresponding to said second smallest aperture; and finally blasting an abrasive powder having a particle size larger than the diameter of a second largest one of said apertures but smaller than the diameter of a largest one of said apertures against said one surface of said multilayer substrate on which said mask is formed, so as to form a deepest one of said blind holes or said through hole at the position corresponding to said largest aperture;

whereby said blind holes and/or said through hole are stepwise formed in said multilayer substrate at the positions corresponding to said apertures of said mask in the increasing order of the diameters of said apertures.

2. A manufacturing method for a multilayer wiring board comprising a plurality of insulating substrates laminated together to form a multilayer substrate; a plurality of circuit patterns formed on both surfaces or one surface of each of said insulating substrates, said multilayer substrate being formed with a plurality of blind holes having different depths and/or a through hole extending selectively through said circuit patterns and said insulating substrates; and a conductive film formed on an inner circumferential surface and a bottom surface of each of said blind holes and/or an inner circumferential surface of said through hole, for electrically connecting said circuit pattern perforated to said circuit pattern exposed to the bottom surface of each of said blind holes and/or . electrically connecting said circuit patterns perforated to each other;

said manufacturing method comprising the steps forming a mask on one surface of said multilayer substrate, said mask having a plurality of apertures registered with said blind holes and/or said through hole to be formed later, said apertures having different diameters depending on the depths of said blind holes and/or said through hole in such a manner that the larger the depth, the larger the diameter;

blasting an abrasive powder having a particle size smaller than the diameter of a largest one of said apertures of said mask but larger than the diameter of a second largest one of said apertures against said one surface of said multilayer substrate on which said mask is formed, so as to form an unfinished hole having a depth smaller than a desired depth at the position corresponding to said largest aperture;

blasting an abrasive powder having a particle size smaller than the diameter of said second largest aperture but larger than the diameter of a third largest one of said apertures against said one surface of said multilayer substrate on which said mask is formed, so as to form an unfinished hole having a depth smaller than a desired depth at the position corresponding to said second largest aperture and simultaneously etch a bottom surface of said unfinished hole formed at the position corresponding to said largest aperture;

finally blasting an abrasive powder having a particle size smaller than the diameter of a smallest one of said apertures against said one surface of said multilayer substrate on which said mask is formed, so as to form a shallowest one of said blind holes at the position corresponding to said smallest aperture;

whereby said blind holes and/or said through hole are gradually formed in said multilayer substrate at the positions corresponding to said apertures of said mask in the decreasing order of the diameters of said apertures in such a manner that at the same time when said shallowest blind hole is completed, the other blind holes and/or said through hole are completed.

3. A manufacturing method for a multilayer wiring board comprising:

a first insulating substrate;

a second insulating substrate laminated under said first insulating substrate;

a third insulating substrate laminated under said second insulating substrate;

a first circuit pattern formed on an upper surface of said first insulating substrate;

a second circuit pattern formed on an upper surface of said second insulating substrate;

a third circuit pattern formed on a lower surface of said second insulating substrate;

a fourth circuit pattern formed on a lower surface of said third insulating substrate;

said first circuit pattern and said first insulating substrate being formed with a first blind hole having a depth corresponding to a total thickness of said first circuit pattern and said first insulating substrate;

said first circuit pattern, said first insulating substrate, and said second insulating substrate being formed with a second blind hole having a depth corresponding to a total thickness of said first circuit pattern, said first insulating substrate, and said second insulating substrate;

said first circuit pattern, said first insulating substrate, said second insulating substrate, said third insulating substrate, and said fourth circuit pattern being formed with a through hole having a depth corresponding to a total thickness of said first circuit pattern, said first insulating substrate, said second insulating substrate, said third insulating substrate, and said fourth circuit pattern;

a first conductive film formed on an inner circumferential surface and a bottom surface of said first blind hole, for electrically connecting said first circuit pattern to said second circuit pattern;

a second conductive film formed on an inner cirumferential surface and a bottom surface of said second blind hole, for electrically connecting said first circuit pattern to said third circuit pattern; and a third conductive film formed on an inner circumferential surface of said through hole;

wherein a diameter of said second blind hole is larger than that of said first blind hole, and a diameter of said through hole is larger than that of said second blind hole;

said manufacturing method comprising the steps of:

forming said second and third circuit patterns on said upper and lower surfaces of said second insulating substrate, respectively;

laminating said first and third insulating substrates on said upper and lower surfaces of said second insulating substrate, respectively, in such a manner that said second circuit pattern is interposed between said first and second insulating substrates, and said third circuit pattern is interposed between said second and third insulating substrates;

forming an upper conductor layer on said upper surface of said first insulating substrate and a lower conductor layer on said lower surface of said third insulating substrate;

forming a mask on said upper conductor layer, said mask having a first aperture having a diameter equal to that of said first blind hole, a second aperture having a diameter equal to that of said second blind hole, and a third aperture having a diameter equal to that of said through hole;

blasting an abrasive powder having a particle size smaller than the diameter of said first aperture against said mask to form said first blind hole at a position registered with said first aperture and simultaneously form first and second unfinished holes each having a depth equal to that of said first blind hole at positions respectively registered with said second and third apertures;

blasting an abrasive powder having a particle size larger than the diameter of said first aperture but smaller than the diameter of said second aperture against said mask to form said second blind hole from said first unfinished hole at the position registered with said second aperture and simultaneously form a third unfinished hole having a depth equal to that of said second blind hole from said second unfinished hole at the position registered with said third aperture;

blasting an abrasive powder having a particle size larger than the diameter of said second aperture but smaller than the diameter of said third aperture against said mask to form said through hole from said third unfinished hole at the position registered with said third aperture; and forming said first conductive film on the inner circumferential surface and the bottom surface of said first blind hole, said second conductive film on the inner circumferential surface and the bottom surface of said second blind hole, and said third conductive film on the inner circumferential surface of said through hole.

4. A manufacturing method for a multilayer wiring board comprising:

a first insulating substrate;

a second insulating substrate laminated under said first insulating substrate;

a third insulating substrate laminated under said second insulating substrate;

a first circuit pattern formed on an upper surface of said first insulating substrate;

a second circuit pattern formed on an upper surface of said second insulating substrate;

a third circuit pattern formed on a lower surface of said second insulating substrate;

a fourth circuit pattern formed on a lower surface of said third insulating substrate;

said first circuit pattern and said first insulating substrate being formed with a first blind hole having a depth corresponding to a total thickness of said first circuit pattern and said first insulating substrate;

said first circuit pattern, said first insulating substrate, and said second insulating substrate being formed with a second blind hole having a depth corresponding to a total thickness of said first circuit pattern, said first insulating substrate, and said second insulating substrate;

said first circuit pattern, said first insulating substrate, said second insulating substrate, said third insulating substrate, and said fourth circuit pattern being formed with a through hole having a depth corresponding to a total thickness of said first circuit pattern, said first insulating substrate, said second insulating substrate, said third insulating substrate, and said fourth circuit pattern;

a first conductive film formed on an inner circumferential surface and a bottom surface of said first blind hole, for electrically connecting said first circuit pattern to said second circuit pattern;

a second conductive film formed on an inner circumferential surface and a bottom surface of said second blind hole, for electrically connecting said first circuit pattern to said third circuit pattern; and a third conductive film formed on an inner circumferential surface of said through hole;

wherein a diameter of said second blind hole is larger than that of said first blind hole, and a diameter of said through hole is larger than that of said second blind hole;

said manufacturing method comprising the steps of:

forming said second and third circuit patterns on said upper and lower surfaces of said second insulating substrate, respectively;

laminating said first and third insulating substrates on said upper and lower surfaces of said second insulating substrate, respectively, in such a manner that said second circuit pattern is interposed between said first and second insulating substrates, and said third circuit pattern is interposed between said second and third insulating substrates;

forming an upper conductor layer on said upper surface of said first insulating substrate and a lower conductor layer on said lower surface of said third insulating substrate;

forming a mask on said upper conductor layer, said mask having a first aperture having a diameter equal to that of said first blind hole, a second aperture having a diameter equal to that of said second blind hole, and a third aperture having a diameter equal to that of said through hole;

blasting an abrasive powder having a particle size smaller than the diameter of said third aperture but larger than the diameter of said second aperture against said mask to form a first unfinished hole having a depth smaller than that of said through hole at the position registered with said third aperture;

blasting an abrasive powder having a particle size smaller than the diameter of said second aperture but larger than the diameter of said first aperture against said mask to form a second unfinished hole having a depth smaller than that of said second blind hole at the position registered with said second aperture and simultaneously form a third unfinished hole having a depth smaller than that of said through hole from said first unfinished hole at the position registered with said third aperture;

blasting an abrasive powder having a particle size smaller than the diameter of said first aperture against said mask to form said first blind hole at the position registered with said first aperture and simultaneously form said second blind hole from said second unfinished hole at the position registered with said second aperture and said through hole from said third unfinished hole at the position registered with said third aperture; and forming said first conductive film on the inner circumferential surface and the bottom surface of said first blind hole, said second conductive film on the inner circumferential surface and the bottom surface of said second blind hole, and said third conductive film on the inner circumferential surface of said through hole.

* * * * *